United States Patent [19]

Bergeron et al.

[11] Patent Number: 4,593,362
[45] Date of Patent: Jun. 3, 1986

[54] BAY PACKING METHOD AND INTEGRATED CIRCUIT EMPLOYING SAME

[75] Inventors: Paul H. Bergeron; Kurt D. Carpenter, both of Chittenden County, Vt.; Jerome B. Hickson, Jr., Yorktown Heights, N.Y.; Roger K. Jackson, Longmont, Colo.; Keith W. Lallier; Elba K. Malone, both of Chittenden County, Vt.

[73] Assignee: International Business Machines Corporation, Armonk, N.Y.

[21] Appl. No.: 495,021

[22] Filed: May 16, 1983

[51] Int. Cl.$^4$ ............................................. G06F 15/46
[52] U.S. Cl. ..................................... 364/488; 364/300
[58] Field of Search ............... 364/488, 489, 490, 491, 364/300

[56] References Cited

U.S. PATENT DOCUMENTS

| T940,013 | 11/1975 | Ho ................................. | 364/489 X |
| T940,020 | 11/1975 | Brechling et al. ............... | 364/491 X |
| 3,567,914 | 3/1971 | Neese et al. ..................... | 364/300 X |
| 3,702,004 | 10/1972 | Eskew et al. .................... | 364/489 X |
| 3,908,118 | 9/1975 | Micka ............................. | 364/490 |
| 4,263,651 | 4/1981 | Donath et al. .................. | 364/491 X |

OTHER PUBLICATIONS

Automatic Artwork Generation for Large Scale Integration; P. W. Cook et al, IEEE Journal of Solid-State Circuits, Dec. 1967, pp. 190–196.

Computer-Aided Wiring Designs; J. L. Kallas, Bell Laboratories Record, Nov. 1964, pp. 343–349.

*Primary Examiner*—Edward J. Wise
*Attorney, Agent, or Firm*—Sughrue, Mion, Zinn, Macpeak, and Seas

[57] ABSTRACT

A wire packing method for packing wire segments in wiring bays of large-scale integrated circuit devices and integrated circuit devices produced employing such a method. Each wiring segment to be placed in a channel of a wiring bay is assigned a score in accordance with criteria developed for the particular application. The start point, end point and a segment identifier is recorded for each segment to be packed. For each channel, segments which can be considered candidates for packing in that channel are extracted from the list. For that channel, moving forwardly from one end of the channel, at the end point of each segment, a total score is calculated by adding to the score of that segment a best score occurring before the start point of the segment. If the total score exceeds a present value of a best string score for nonoverlapping segments, the present value of the best string score is replaced by the new total score, otherwise the present value of the best string score is retained. When the other end of the bay is reached, moving back towards the first end, segments are assigned to the channel for which the total score therefor exceeded the then-present value of the best string score and which do not overlap already-assigned segments.

24 Claims, 15 Drawing Figures

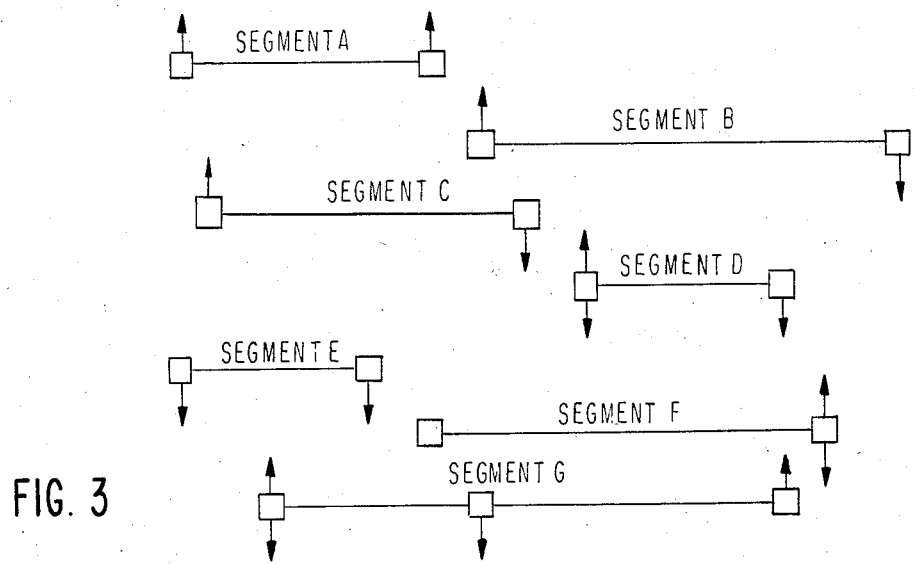
FIG. 3
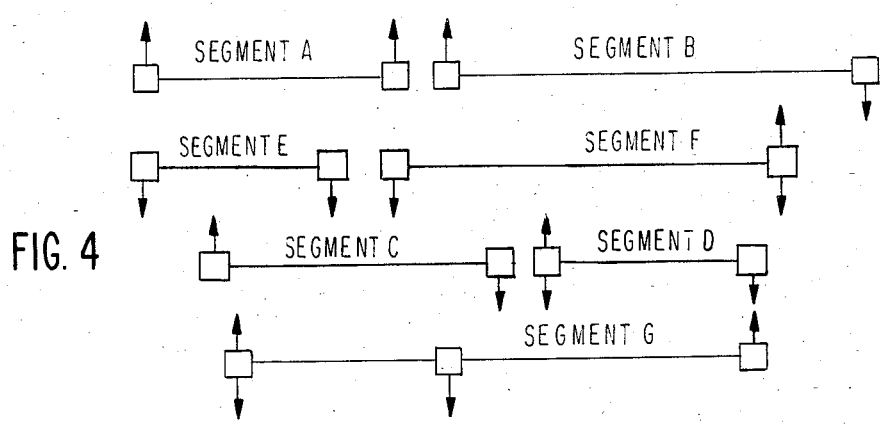
FIG. 4
FIG. 5
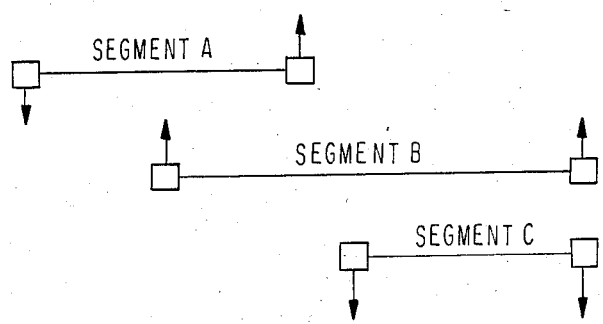

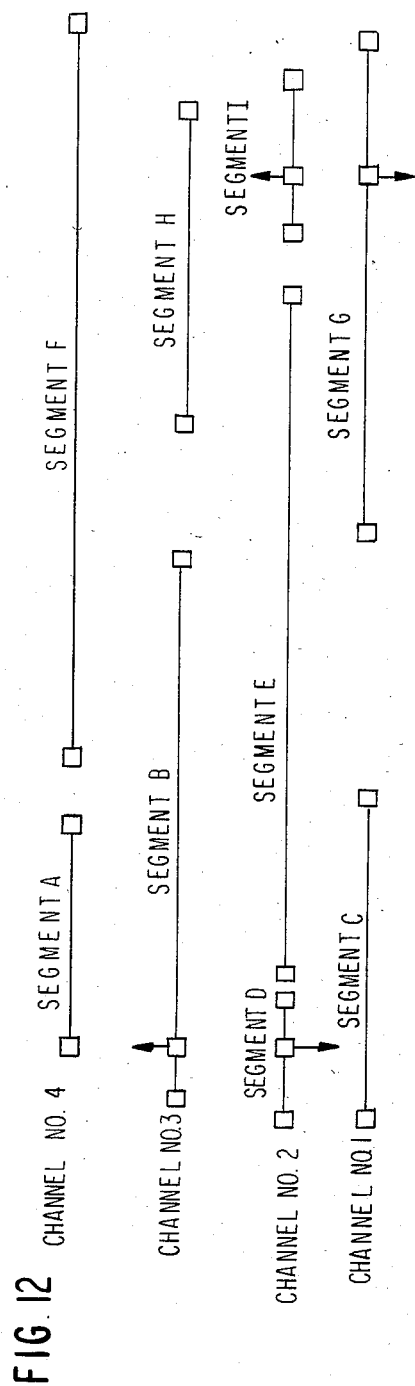
FIG. 12
FIG. 13
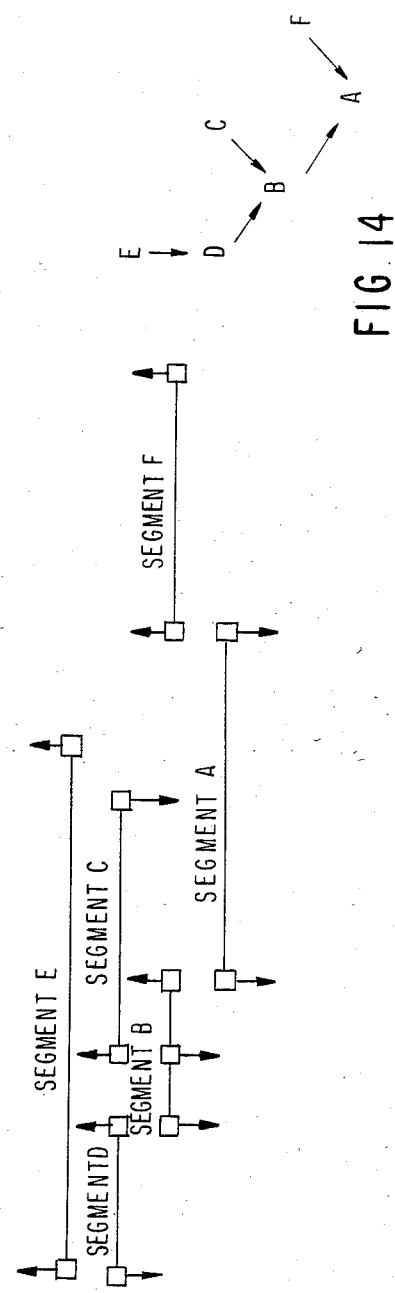
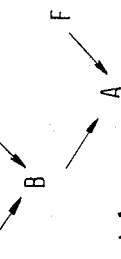
FIG. 14

BAY PACKING METHOD AND INTEGRATED CIRCUIT EMPLOYING SAME

BACKGROUND OF THE INVENTION

The invention pertains to a method for arranging wire conductors within a limited number of channels within predefined constraints. More specifically, the invention pertains to a method for arranging wire segments within allocated channels in bays between rows of adjacent circuits, or over the circuits when the composition of the circuits does not block wiring channels on that particular level of wiring, and particularly in large-scale integrated circuit devices. Further, the invention pertains to integrated circuit devices constructed in accordance with such a method.

"Bay packing", which is a general term descriptive of the method of the invention and the problem intended to be solved by the invention, is an often-encountered problem in the design of large-scale integrated circuit chips. As depicted in FIG. 1, a large-scale integrated circuit chip 10 is sometimes composed of a number of rows 12 of individual circuits 14 arranged back to back. The areas 16 between adjacent rows 12 of such circuits and an area 18 between adjacent columns of such circuits are known as "bays". It is necessary to make interconnections among the circuits 14 using metal or polysilicon conductive lines or the like, herein included under the term "wire". It is of course possible to arrange such wires in both horizontal and vertical directions and on several different levels separated from one another by an insulating material with connections made between levels through connectors known as "vias". Generally, the wires on any one level are defined to be parallel to one another.

With reference to FIG. 2, because there is only a limited about of space between adjacent rows 12 of circuits 14, the number of possible parallel wires at any one point is limited. The possible locations for laying down these wires are known as "channels", depicted in FIG. 2 by dashed lines and identified by reference numeral 17. Each of these circuits 14 will have one or more terminal pads 20 associated therewith for making connections among the various circuits 14. For instance, to make a connection between the terminal pad 20-1 and the terminal pad 20-2, wires 15-1 and 15-3, indicated by dotted lines, are layed down on a lower level of the bay 16. Then, the wires 15-1 and 15-3, along with other wires on the same level, are covered by a layer of insulating material. The ends of the wires 15-1 and 15-3 are then joined by a wire 15-2 layed down in one of the channels 17 on a second level of the bay. Connections between the ends of the wire 15-2 and the wires 15-1 and 15-3 are made through vias 13-1 and 13-2 which penetrate the insulating layer between the upper and lower wiring levels and make connection therebetween. There will, of course, ordinarily be many more wire segments in a bay than are depicted in FIG. 2. Also, the access wires to the terminal pads can be on a level either above or below the level of the bay being packed.

A convenient way for presenting a bay packing problem is to provide a chart of all wire segments which are to be packed at each level in a particular bay with an indication of where the vias associated with each segment are to be placed and with an indication of the directions from the vias in which extend the connecting wires on the adjacent level or levels. An example of such a chart is shown in FIG. 3. In FIG. 3, vias are shown as boxes and the direction of connecting segments on the next level indicated with arrows. Additionally, the positions of the start and end points along the bay should be specified, which may be done in arbitrary units, with reference to a given start point at one end of the bay.

The objective of any bay packing method is, of course, to position each wire segment in a channel while using the fewest channels when an indeterminant (i.e., variable) number of channels are available in the bay, or using no more channels than are available in the particular bay when a fixed number of channels has previously been assigned to the bay, without overlapping segments or violating other constraints. One such approach, termed "left-edge" packing, is described by A. Hashimoto et al., "Wire Routing by Optimizing Channel Assignment Within Large Apertures", *Proceedings of Eighth Design Automation Workshop*, 1971, pp. 155-169. In accordance with this technique, a first wire segment is assigned to a channel starting at one end of the bay with the next possible segment from among the list of segments to be packed which can fit into the channel without overlapping segments previously assigned to that channel being assigned next. When no segment if available to assign to the remainder of the channel, the channel is considered finished and the packing of the next channel started. This technique is called "left-edge" packing because one generally proceeds from the channel on one side of the bay (the "left edge") toward the other side of the bay.

A major difficulty with left-edge packing is that there are almost always other factors to be considered in addition to the mere fit of the segments. For instance, if this techique were applied to the chart of segments shown in FIG. 3 (with the "left" being at the top), the result would be as shown in FIG. 4. It may readily be appreciated that this result would be totally unacceptable because, for instance, the perpendicular conductors on the other level of the channel for the right ends of segments D and G would have to be coterminous, thus providing an unwanted shortcircuit between the segments D and G. Such interference between two competing segments is termed a "constraint".

Besides such constraints, the left-edge packing technique suffers from other drawbacks. Specifically, it may be required that particular segments be "attracted" to specific wiring channels, that is, there may be imposed a condition that particular segments occupy specific channels so as to connect to closely adjacent circuits. Such conditions may result in missed connections using left-edge packing. Also, assigning a segment to a specific channel may increase the amount of wire needed on another plane. Via restrictions and other technology rules can also cause problems for left-edge packing. For example, there may be imposed restrictions of no horizontally adjacent vias, no via adjacent a circuit contact unless it is in the same network, no via adjacent a second-level metal line, and no via on top of a circuit contact. Crosstalk between adjacent parallel lines is a further example of a different kind of problem that might also affect packing. Left-edge packing does not adequately handle any of these problems.

Yet further, even if constraints are honored, left-edge packing is disadvantageous in that it does not have any "look-ahead" capability. Without such a capability, the necessarily imposed constraints may cause more than a minimum number of channels to be used. An example of such a situation, as described by B. W. Kernighan et al., "An Optimum Channel-Routing Algorithm for Polycell Layouts of Integrated Circuits, *Proceedings of the Tenth Design Automation Workshop,* 1973, pp. 50-59, is depicted in FIG. 5 which shows the result of using left-edge packing for packing three segments A, B and C as shown. Because segment A starts first, the left-edge packing method requires that it be packed first. Segment B cannot share the first channel with A because they overlap. Hence, segment B is packed in a separate channel. Segment C is constrained to be below segment B because the right-end connections on the other level would otherwise interfere. Thus, the end result is that three channels have been used. However, it may clearly be seen that by packing segment B first even though it does not start first, the result would be the use of only two channels.

An improvement on the basic left-edge packing technique, as described in the above-mentioned paper by Kernighan et al., extends the left-edge packing technique with the use of the concepts of zones. Zones are used to define sets of segments which can be used for abutments without affecting the total number of channels required. Specifically, some abutments are considered "good enough" to keep the number of necessary channels at a minimum, even through the abutments may not be as close as possible. FIG. 6 is an example of a minimal channel utilization which is obtained using such a technique which does not provide minimal abutments between segments. In FIG. 6, segment D, for instance, could abut more closely with segment A than does segment B, and segment G could abut more closely with segment D than does segment E. But in any of those causes, three channels would still be required.

The zone concept provides alternatives that are equally good in terms of fit, but provides no mechanism for chosing among them. While helpful, this technique is thus not completely adequate. That is, selecting among the alternatives by selecting the one which relieves the most constraints will not always provide the best overall result because channel packing is combinatorial in nature. For instance, it may be more important to pack segment A than segment B in the top channel in the situation shown in FIG. 6, but the combination of segment B with others may give a better total result than any possible combination of segments with segment A for that channel. Thus, the zone concept does not solve the basic difficulties inherent with left-edge packing. For example, the problem presented by FIG. 5 would not be properly handled.

A "branch and bound" approach is also described in the above-mentioned article by Kernighan et al. in which the bay-packing process is viewed as the exploration of a tree structure. At each branch point, one segment is chosen to be packed next. Whenever, a channel is finished, an attempt is made to look ahead to determine the minimum number of channels that must be consumed if the current assignments are to be maintained. If the predicted minimum is not satisfactory, then the assignments already made are reconsidered. The main advantage of this approach is that a satisfactory solution will be found if one exists.

However, the time required for executing channel assignments using the branch and bound approach depends greatly on the time used in looking ahead to predict the channel requirement of the eventual result. If "bad" paths can be recognized early, time can be saved both in pursuing those paths and in backing up. If the objective is to find a minimum solution, considerable exploration may be required since it is difficult to recognize a minimum solution without exploring the whole "tree". Thus, unless the problem is relatively easy, the branch and bound approach is not generally acceptable because of the long time that it requires in order to obtain a minimal, or even satisfactory, solution.

A yet further approach to bay packing is described by K. A. Chen et al., "The Chip Layout Problem: An Automatic Wiring Procedure", *Proceeding of the Fourteenth Design Automation Conference,* 1977, pp. 298-302. In accordance with the technique described in this article, the affinity of segments for one side of the bay or the other is used as a tie breaker during the assignment process. That is, when there is a choice of segments to assign, preference is given to the one with the most connections to the near side of the bay. This helps to reduce lengths of connecting wires, and in some technologies is important for electrical performance. Also, constraints on remaining segments are reduced, even if these constraints are not explicitly defined and attacked. Yet further, by using affinity for the segments which are packed prior to the perpendicular segments on another plane, the number of channels required on the other plane is reduced. However, important constraints may still remain unsolved while segments with many relatively unimportant connecting segments are packed. This can lead to problems with segments that are later packed.

A "linear assignment" process for assigning segments to channels is also known from the above-discussed Chen et al. article. The basic procedure is to start from one end of the bay and simultaneously make assignments to all channels one "cell" at a time. If a segment has already has been assigned to a particular channel, it is attempted to maintain that segment in the same channel for subsequent cells. The affinity of segments for other channels is also considered and is especially important when circuit contacts are on specific channels. The affinity for one side of the bay or other is also used to shorten the connecting wires. Some lookahead can be used, and decisions are based not only on the current cell but also on the cells to be processed next.

Segments may change channels using this approach. This enables affinities to be satisfied, but is disadvantageous if channel changing increases channel consumption. Also, changing channels often requires additional perpendicular segments to be layed down on different wiring planes. Furthermore, a single connection may require parallel segments on different channels in the same bay. If there is not sufficient space to accommodate such additional conductors, an overflow may occur. If the number of additional channels required could be accurately estimated during global wiring, then that number could be reserved and channel switching more easily accomplished. Unfortunately, there is no quick and accurate method for making such estimates, and thus switching channels without adequate lookahead may impose serious problems.

The article T. Asano et al., "A Wire-Routing Scheme Based on Trunk-Division Methods", *IEEE Transactions on Computers,* Volume C-26, no. 8, 1977 provides a description of how to handle constraints among segments in bay packing. Cycles of constraints sometimes occur in the initial definition of the bay-packing problem. These require division of a segment or some other solution before the actual bay packing can be successful.

FIG. 7 shows an example of such a constraint cycle and one possible solution. In FIG. 7, segment A must be above segment B, segment B must be above segment C, and segment C must be above segment A. It is thus clearly not possible to arrange the segments without interference on the other wiring plane. The solution of such a constraint cycle requires that another definition of the segments be found, typically involving dividing at least one of the segments into two new segments, as shown in the lower portion of FIG. 7 wherein segment A has been divided into two new segments $A_1$ and $A_2$.

Long chains of constraints, as illustrated in FIG. 8, can also prevent successful conclusion of the bay-packing problem. In this case, if the segments A to F are arranged in any other order other than what is shown, interference between perpendicular wires on the other wiring plane is unavoidable. Thus, an acceptable method of bay packing must be capable of recognizing and addressing the problems of constraint cycles and long constraint chains so that all segments and constraints are defined and adequately dealt with.

Accordingly, it is an object of the present invention to provide a method for packing wires in channels of bays of large scale integrated circuit devices which avoids all of the above-mentioned drawbacks.

More specifically, it is an object of the present invention to provide a bay packing method, and accordingly, an integrated circuit device constructed utilizing such as a bay packing method, in which all types of constraints are honored, and yet a near optimum bay-packing arrangement is rapidly found using the criteria considered important. Often the criteria involves minimizing the bay width.

SUMMARY OF THE INVENTION

The above and other objects of the invention are met by providing a method for packing a plurality of wire segments in a wiring bay which may be composed of a plurality of allocated wiring channels, or may be composed of an indeterminant number of wiring channels, including steps of selecting an unpacked channel from among the available wiring channels, assembling a list of segments which are candidates for packing on that channel, assigning segments to the selected channel in accordance with a selection procedure of the invention, and repeating the above steps for the remaining channels. The channel chosen for packing can be arbitrary or random, or it can be chosen in accordance with a predetermined selection procedure, several examples of which are given below. The segment-assigning procedure of the invention includes steps of determining a score for each of the segments; upon the occurrence of end points of any segment starting from one end of the wiring bay, determining a total score by adding to the score of the segment a best string score for any string of segments a last end point of which occurs before a start point of that segment; if the total score for that segment exceeds a present value of a best string score for any string of segments, retaining as a new value of the best string score for any string of segments the total score, in which case an identifier for that segment is recorded, and otherwise the present value of the best string score for any string of segments is retained; and repeating these steps until the end of the bay is reached.

The total score may be determined at each end point of each of the segments. Alternatively, it is possible to divide the wiring bay into zones with zone boundaries occurring, for example, at each segment's left end point which immediately follows another segment's right end point in a left-to-right scan through all the segments and, at each zone boundary encountered, determining the total score for each segment which ended in the contiguous prior zone. Other definitions of zone boundaries may also be used. For example, zone boundaries may occur anywhere between the end point of one segment (moving toward the end of the channel) and the next start point of a segment. Also, the zone boundaries may be set at the boundaries of the various circuits. Thus, unless otherwise specifically stated, the terms "zone" and "zone boundary" and the like herein means any zone and boundary definition that is efficacious for the particular packing problem at hand. The scoring procedure employed for assigning scores to each of the segments may be varied in accordance with the particular problem at hand, and may include considerations such as constraints among segments, segment lengths, the profile of the wiring bay, various technology rules, and similar considerations. It is important to note that, although reference is made to the example of large-scale integrated circuits, the invention is equally applicable to circuit cards, circuit boards, planar packages, thermal conduction modules, and the like. All such devices are herein included under the term "circuit device".

One of the powerful features of the invention is the ability to change scores for segments depending on the particular channel, for example, segments with high affinity for one side of the bay get higher scores when channels on that side of the bay are packed. Also, a long constraint chain becomes progressively more critical as more channels are packed, leading to higher scores for segments in the chain.

BRIEF DESCRIPTION OF THE DRAWINGS

FIG. 3 is a diagram showing an example of wire segments which may be used to perform interconnections between individual circuits of the integrated circuit device of FIGS. 1 and 2;

FIG. 4 is diagram showing the wire segments of FIG. 3 assigned to specific wiring channels;

FIGS. 5–7 are wire segment diagrams showing the assignment of wire segments to wiring channels as would be achieved by prior art techniques;

FIG. 12 is a wire segment diagram showing the result of applying the invention to the set of wire segments shown in FIG. 10;

FIG. 13 is a wire segment diagram used in a discussion of a constraint processing routine used in the segment scoring procedure depicted in the flow chart of FIG. 11B; and FIG. 14 is a constraint diagram derived from the wire segment diagram of FIG. 13.

DESCRIPTION OF THE PREFERRED EMBODIMENTS OF THE INVENTION

Figure 1:
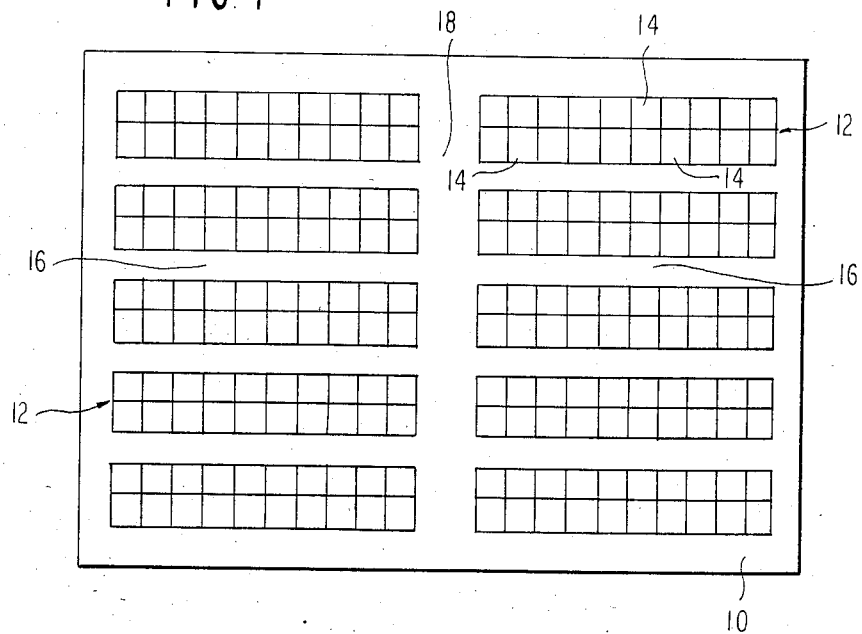
FIG. 1 is a top schematic view of a large-scale integrated circuit device to which the invention may be applied.
Figure 2:
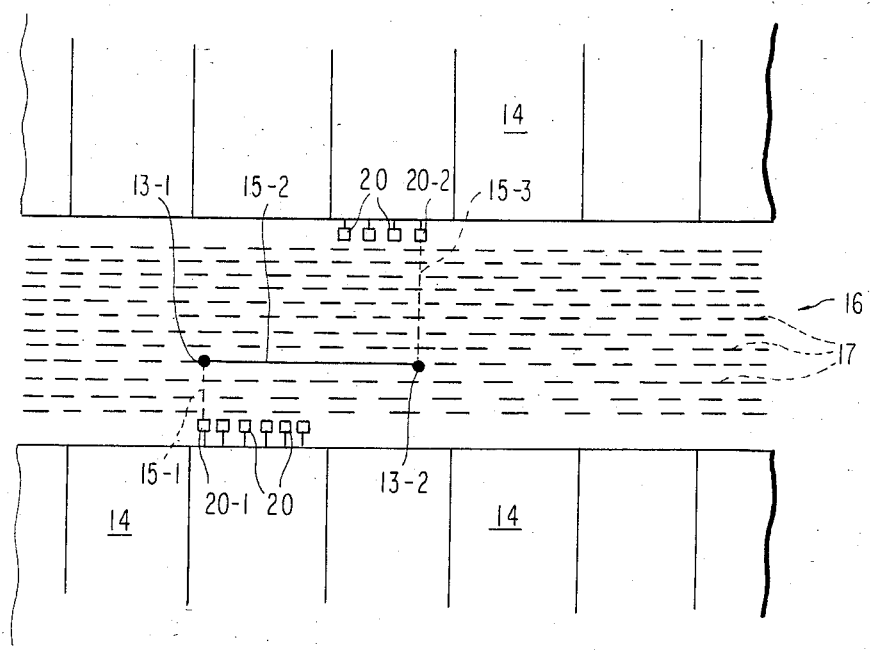
FIG. 2 is an enlarged view of a portion of the device of FIG. 1.
Figure 6:
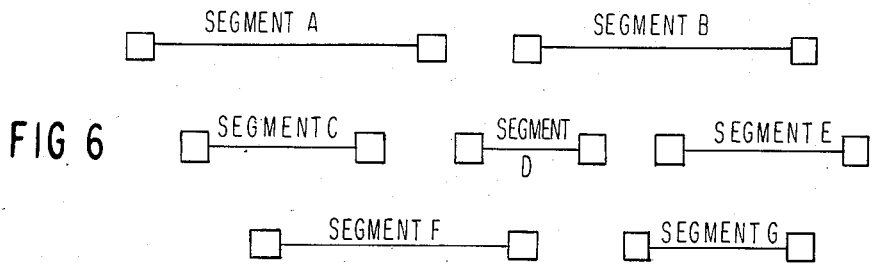
Figure 7:
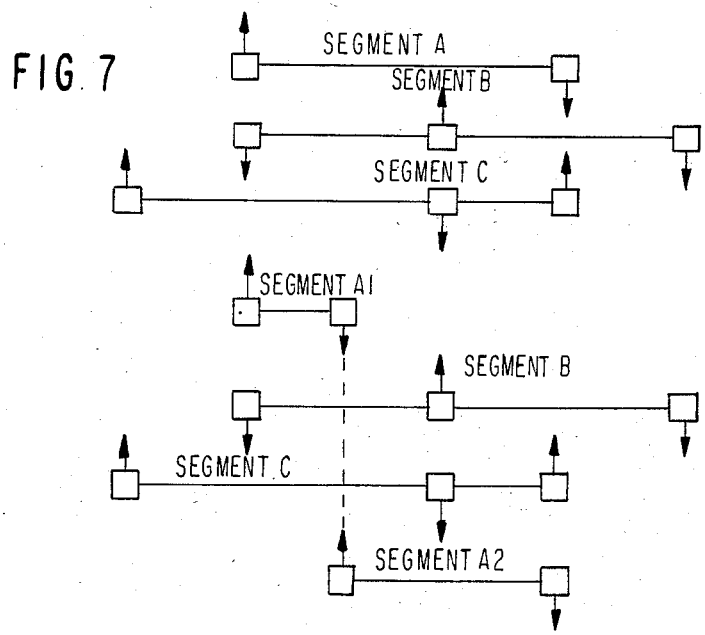
Figure 8:
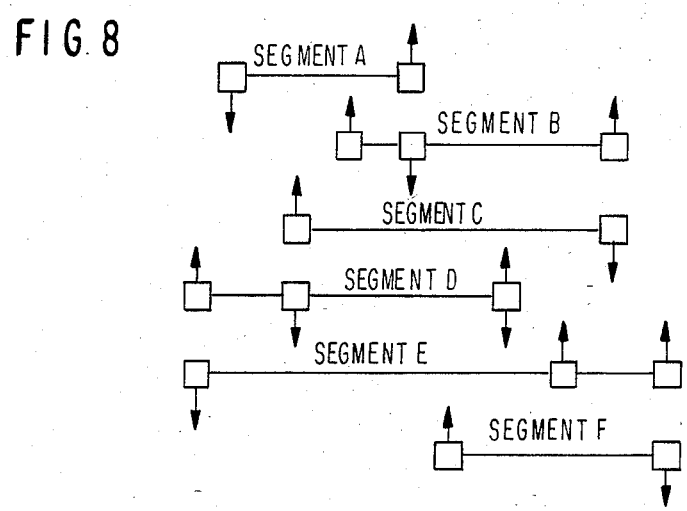
FIG. 8 is wire segment diagram used for illustrating the occurrence of a constraint chain among segments.
Figure 9:
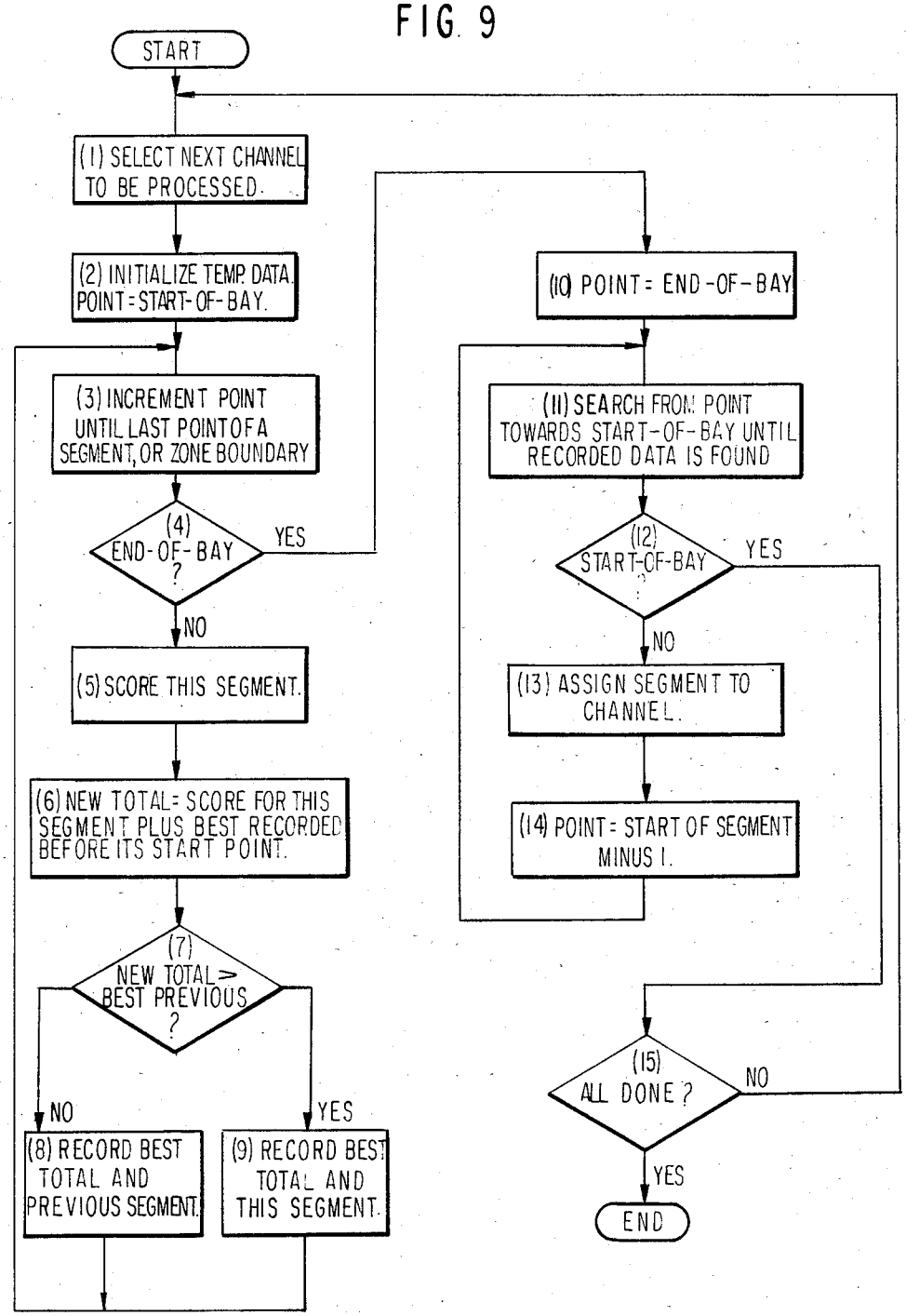
FIG. 9 is a flow chart used to describe a preferred embodiment of the invention.

FIG. 9 is a flow chart which describes a preferred embodiment of a bay-packing method of the invention. The method of the invention will be explained below with the numbered boxes of the flow chart corresponding to the following numbered paragraphs:

(1) First, after a list of all segments has been made including segment identifiers, and start and end points, the first channel to be processed is selected. Several ways are possible for channel selection including: (a) alternating from side to side; (b) starting at one side of the bay, particularly, a side for which segments have an affinity, and continuing until the other side is reached; and (c) starting from the center of the bay and assigning channels in a predetermined order. Segments which have already been packed or which for some reason cannot be packed in the present channel are eliminated. It is to be noted that each channel is processed only once utilizing the method of the invention.

(2) Temporary recording areas are initialized. This involves recording the start and end points of each segment along the bay. Of course, as described above, the bay should be "calibrated", including defining a start point at zero. Arbitrary units may be employed. The variable POINT represents the current position along the bay.

(3) POINT is incremented until the occurrence of the first end point of any segment considered for assignment to the present channel. If more than one segment ends at the same place, each is processed in turn. Alternatively, zone boundaries can be employed in which a zone boundary is located at the start point of each segment for which another segment has ended in the immediately previous zone or located anywhere between the last segment end point and the next start point. In this case, POINT is incremented up to the first zone boundary.

(4) If the end of the bay has been reached, all segments must have then been processed. In that case, proceed to point (10) below. If another segment is found by incrementing POINT (with the current value of POINT being below the value thereof defining the end point of the bay), the procedure continues.

(5) Assuming that another segment is found, that segment is scored. A number of different scoring techniques can be used, and the invention is not limited to any particular technique. An example of scoring will be given below. In any event, scoring a segment involves assigning to that segment a number which represents the "goodness" of assigning this particular segment to the present channel being processed and takes into account various constraints and other factors that may be associated with the segment. Alternatively, the scoring may be done prior to step (1), and the segment's score merely fetched from where it was earlier stored.

(6) A new total is then computed which is derived by adding the score for the present segment under consideration plus the best total score for any string of segments which end before the starting point of the presently considered segment. The best total score may very quickly be found with a simple table look-up operation. There is no extensive combinational processing required with the invention. If zone boundaries are employed, the best total score for all segments ending in the zone immediately prior to the present boundary is calculated.

(7) The new total found in step (6) is compared with the very best total score previously found for this channel. If there is a tie, the choice is arbitrary since all factors which might be used to discriminate between the two strings of segments are already incorporated in the score.

(8) If the new total is not greater than the best total score previously found for the channel, the procedure continues on the next segment while looping back to step (3).

(9) If, on the other hand, the total score using this segment is better than the best total score previously recorded, this segment is part of the best string of segments up to this point, and its identifier (number or letter) and the new best total score are recorded at the present value of POINT or at some loaction which is identified with the present value of POINT.

(10) When all available segments have been considered, the value of POINT will either be the end point of the last segment or the value of POINT which defines the end of the bay.

(11) From the present value of POINT, POINT is decremented towards the start of the bay until reaching the next value of POINT for which data has been recorded.

(12) If the start point of the bay has been reached, there are no more recorded data items to consider, and the channel is thus finished.

(13) If the beginning of the channel has not been reached, the segment identified in the recorded data at the present value of POINT (where recorded data is found) is a member of the very best scoring string between this point and the start of the bay. It is guaranteed that this segment does not overlap any segment already packed in the channel. The segment is then assigned to the channel.

(14) POINT is set equal to the starting point of the just-packed segment minus one. This ensure that the next segment found during the search for segments to be packed (step 11) will not overlap the segment just packed.

(15) Once the channel has been completely packed, it is necessary to test to determine whether more processing is required for the bay, that is, to determine whether there are more channels remaining to be packed. If there are, the procedure returns to step (1). If not, the procedure is finished.

Some examples of bay packing utilizing the above-described method will now be discussed.

A first example of the invention for the case where computations are carried out at the end of each segment will be described. In this example, segments A to H having end points and scores as follows are assumed:

| Segment | End points | | Score |
| --- | --- | --- | --- |
| C | 4 | 8 | 30 |
| A | 1 | 15 | 20 |
| B | 2 | 16 | 40 |
| E | 10 | 19 | 30 |
| D | 6 | 24 | 70 |
| F | 10 | 24 | 50 |
| G | 18 | 30 | 50 |
| H | 20 | 32 | 20 |

The procedure for packing the first channel is as follows:

| | Recorded Data | | |
|---|---|---|---|
| | Best Total Score | Last Segment | Point |
| (1) Search from POINT = 1 until the first high end point of a segment (segment C) is found, and record the segment and end point. | 30 | C | 8 |
| (2) Continue searching until the next high end point is found (segment A). Notice that using segment A would result in a score worse than that already found. Do not record new data. | 30 | C | 15 |
| (3) Search until next high end point (segment B) is found, and record best score. | 40 | B | 16 |
| (4) Search until next end point is found (segment E). Best total score is sum of E's score and best score prior to POINT = 10 where segment E starts. Record this data. | 60 | E | 19 |
| (5) Search until POINT = 24 where both segments D and F end. Even though segment D has a large score, the combination of F and the best score prior to its starting point for segments with which segment F does not overlap is better. Record F and this score. | 80 | F | 24 |
| (6) Search until the end of segment G. Combination of G and best score prior to POINT = 18 is better than previously discovered best total. | 90 | G | 30 |
| (7) Search until end of segment H. Total using segment H is 80, but a higher total has already been obtained so that nothing new is recorded. | 90 | G | 32 |
| (8) Search for the next end point. None is found, so the initial sweep is done. | 90 | G | 32 |
| (9) The last recorded entry for the best total score uses segment G. Assign it to the channel. | | | |
| (10) Search for best total score recorded prior to POINT = 18 where segment G started. This leads to segment B, which is assigned to the channel. | | | |
| (11) Search for recorded data prior to POINT = 2 where segment B started. None is found, so the packing of the first channel is completed. | | | |

The procedure is repeated for the subsequent channels.

Figure 10:
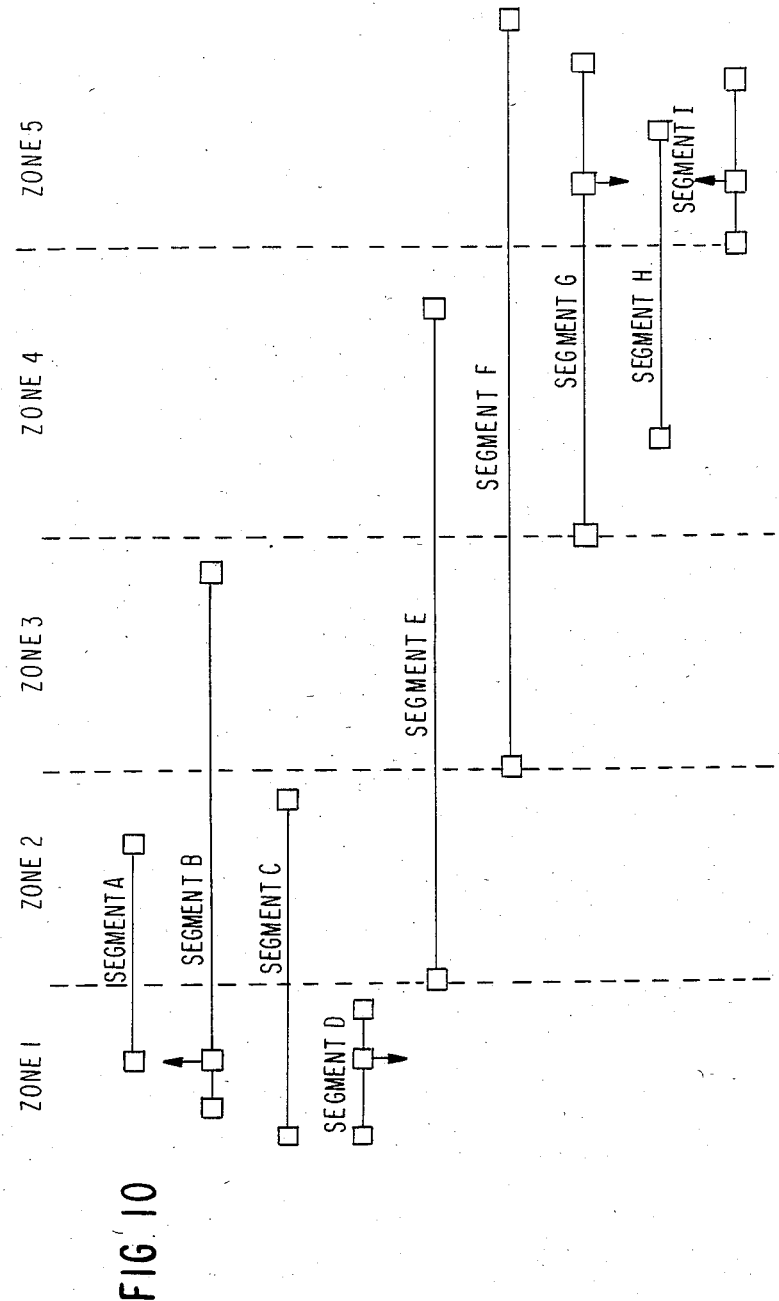
FIG. 10 is a wire segment diagram used in a discussion of an example of the invention.

In the second example, the zone definition approach is utilized. The segments to be packed using the procedure of the invention in this first example are depicted in the chart of FIG. 10. It is assumed that there are four channels available for packing the segments A to I. From the chart of FIG. 10, it can be noticed that there are two apparent constraints, specifically, segment B must be above segment D and segment I must be above segment G. As discussed above, zone boundaries are set at locations along the channel where a segment starts if at least one segment has ended in the contiguous prior zone.

Now, an example of a scoring procedure will be discussed with reference to the flow chart of FIGS. 11A and 11B and Tables 1 to 3 below. Table 1 gives zone information for channel no. 1, specifically, the number of channels available, the channel demand (the absolute minimum number of channels needed determined by the number of segments which pass through that zone), and the overflow (channel supply less channel demand). Table 2 lists constraint information for channel no. 1, that is, for each constraint noted in the chart of FIG. 10. Specifically, the segment B to segment D constraint and the segment I to segment G constraint. Table 2 again lists the channel supply (four), and also gives the constraint channel demand (the minimum number of channels required for all segments in the chain taking into account restrictions imposed by the geometric shape of vias) and the constraint overflow (constraint channel supply minus constraint channel demand). Table 3 is a scoring table, the usage of which will be explained below. All segments are given both a zone score and a constraint score, the sum of which is the total score for the segment.

Figure 11A:
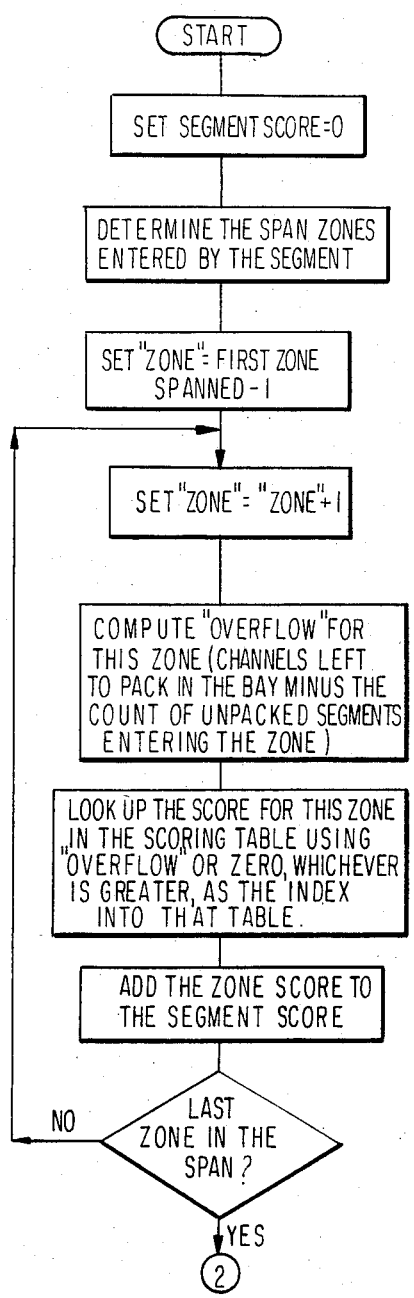
FIGS. 11A and 11B, taken together, are a flow chart describing a segment scoring process which may be used with the invention.
Figure 11B:
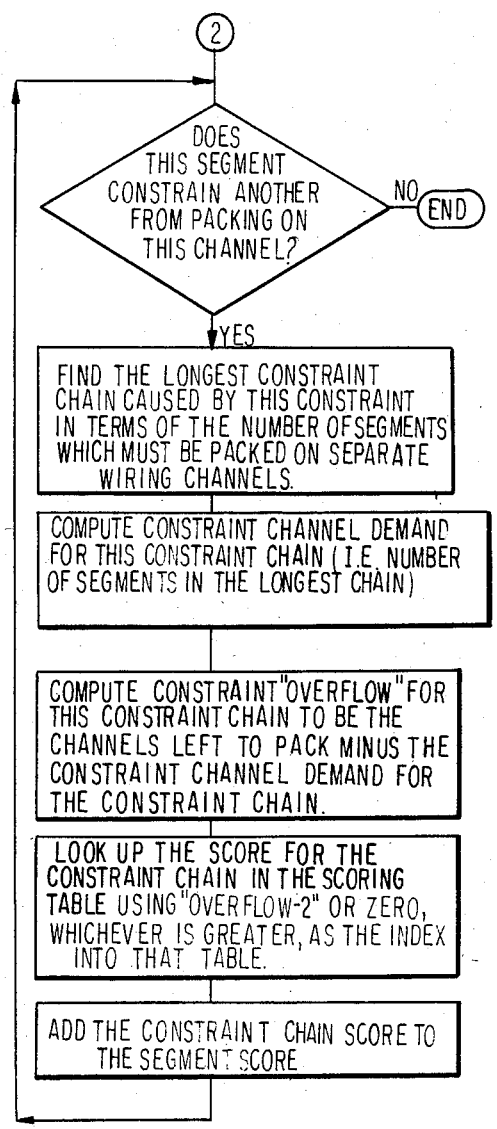

With reference to the flow chart of FIG. 11A, each unpacked and unconstrained segment is scored for each channel and for each zone of that channel through which it passes. First, the segment score for the segment being scored is set equal to zero. The span of zones entered by the segment is then entered, and then a variable ZONE is set equal to the number of the first zone spanned minus one. ZONE is then incremented by one, after which the overflow (given by the variable OVERFLOW) for this zone is computed by determining the number of channels left to pack in the bay minus the count of unpacked segments entering the zone. The score for the segment in the zone is then found by performing a look-up operation in Table 3 using as an index OVERFLOW or zero, whichever is greater. The zone score for the segment is then added to the total score to the present for the segment. The procedure is repeated until the last zone through which the segment passes is completed.

Next, with specific reference to FIG. 11B, the constaint scoring procedure will be discussed. In this portion of the scoring procedure, it is first determined whether the segment constrains another segment from packing on this channel. If not, the procedure is at an end. If such a constraint is noted, the longest constraint chain caused by this constraint in terms of the number of segments which can be packed on separate wiring channels is found, after which the constraint channel demand for this constraint chain, defined as the number of segments in the longest chain (as has been assumed in the example, such that no restrictions are imposed by the geometric shapes which make up vias).

FIG. 13 shows an example where chain constraints arise, and FIG. 14 is a constraint chain graph. As can be readily seen from FIGS. 13 and 14, segment A has two constraints, one with segment D and the other with segment F. At the diamond-shaped decision box in FIG. 11B, the answer will thus be "yes", twice. The longest constraint chain caused by the B to A constraint is four, that is, segments A, B, D and E. The longest constraint chain caused by the F to A constraint is two.

Next, the constrain overflow (the value of which is given by the variale CONSTRAINT OVERFLOW) for the constraint cahin is determined as the number of channels left to pack minus the constraint channel demand for the constraint chain. The score for the constraint chain is then looked up in the scoring table, Table 3, using as an index the larger of OVERFLOW minus two and zero. The constraint chain score is then added to the segment score. The values OVERFLOW, CONSTRAINT CHANNEL DEMAND and CONSTRAINT OVERFLOW are tabulated in Table 1 and 2. The resultant scores for channel no. 1 of the example under consideration are presented in Table 4.

With these values assembled, segments can be scored for channel no. 1. With reference to Table 5, at the end of zone no. 1, only segment D has ended. Hence, the best scoring string of segments found by the end of zone no. 1 is only segment D with a string score of 1000. At the end of zone 2, three segments have terminated, segments A, C and D. As portions of these three all overlap, none of the scores of the segments can be summed as yet. As all three segments have the same total score of 1000, it is arbitrary as to which is chosen. As an example, segment C has been chosen in Table 5. Similarly, at the end of zone 3, the choice is still arbitrary (segment C alone). However, at the end of zone no. 4, in which segement E terminates, a score of 2100 is obtained by adding the scores of segments of D and E, which is higher than any other total score which can be obtained by adding total scores of segments which can be possibly strung together. Finally, at the end of zone no. 5, the highest total possible score is 2500, obtained by adding the scores of segments G and C. Thus, segments G and C are chosen for channel no. 1 and assigned thereto, as indicated in FIG. 12.

For channel no. 2, segments C and G are eliminated from consideration. By following the same procedure discussed above, segments D, E and I are chosen for channel no. 2. Similarly, segments B and H are chosen for channel no. 3 and segments A and F for channel no. 4. The segment and total scores for these cases are tabulated in Tables 6 to 11. As can readily be seen from the completed arrangement shown in FIG. 12, all segments are packed within the available four channels while honoring all necessary constraints.

TABLE 1

| ZONE INFORMATION FOR CHANNEL NO. 1 | | | | | |
|---|---|---|---|---|---|
| ZONE | 1 | 2 | 3 | 4 | 5 |
| CHANNEL SUPPLY | 4 | 4 | 4 | 4 | 4 |
| CHANNEL DEMAND | 4 | 4 | 3 | 4 | 4 |
| OVERFLOW | 0 | 0 | 1 | 0 | 0 |

TABLE 2

| CONSTRAINT INFORMATION FOR CHANNEL NO. 1 | | |
|---|---|---|
| | B | I |
| | ↓ | ↓ |
| CONSTRAINT CHAIN | D | G |
| CHANNEL SUPPLY | 4 | 4 |
| CONSTRAINT CHANNEL DEMAND | 2 | 2 |
| CONSTRAINT OVERFLOW | 2 | 2 |

TABLE 3

| SCORING TABLE | |
|---|---|
| INDEX | SCORE |
| 0 | 500 |
| 1 | 100 |
| 2 | 25 |
| 3 | 10 |
| 4 | 0 |

TABLE 4

| | | SEGMENT SCORES - CHANNEL NO. 1 | | | | | | |
|---|---|---|---|---|---|---|---|---|
| SEGMENT | ZONE SPAN | ZONE NO. 1 SCORE | ZONE NO. 2 SCORE | ZONE NO. 3 SCORE | ZONE NO. 4 SCORE | ZONE NO. 5 SCORE | CONSTRAINT SCORE | TOTAL SCORE |
| A | 1-2 | 500 | 500 | 0 | 0 | 0 | 0 | 1000 |
| B | 1-3 | CONSTRAINED FROM CHANNEL NO. 1 BY SEGMENT D | | | | | | |
| C | 1-2 | 500 | 500 | 0 | 0 | 0 | 0 | 1000 |
| D | 1 | 500 | 0 | 0 | 0 | 0 | 500 | 1000 |
| E | 2-4 | 0 | 500 | 100 | 500 | 0 | 0 | 1100 |
| F | 3-5 | 0 | 0 | 100 | 500 | 500 | 0 | 1100 |
| G | 4-5 | 0 | 0 | 0 | 500 | 500 | 500 | 1500 |
| H | 4-5 | 0 | 0 | 0 | 500 | 500 | 0 | 1000 |
| I | 5 | CONSTRAINED FROM CHANNEL NO. 1 BY SEGMENT G | | | | | | |

TABLE 5

| TOTAL SCORES - CHANNEL NO. 1 | | | | | |
|---|---|---|---|---|---|
| ZONE NO. | 1 | 2 | 3 | 4 | 5 |
| BEST SCORING SEGMENTS FOUND IN ANY SCANNED ZONE | D | C | C | E-D | G-C |
| STRING SCORE | 1000 | 1000 | 1000 | 2100 | 2500 |

TABLE 6

| | | SEGMENT SCORES - CHANNEL NO. 2 | | | | | | |
|---|---|---|---|---|---|---|---|---|
| SEGMENT | ZONE SPAN | ZONE NO. 1 SCORE | ZONE NO. 2 SCORE | ZONE NO. 3 SCORE | ZONE NO. 4 SCORE | ZONE NO. 5 SCORE | CONSTRAINT SCORE | TOTAL SCORE |
| A | 1-2 | 500 | 500 | 0 | 0 | 0 | 0 | 1000 |
| B | 1-3 | CONSTRAINED FROM CHANNEL NO. 2 BY SEGMENT D | | | | | | |
| D | 1 | 500 | 0 | 0 | 0 | 0 | 500 | 1000 |
| E | 2-4 | 0 | 500 | 500 | 500 | 0 | 0 | 1500 |
| F | 3-5 | 0 | 0 | 500 | 500 | 500 | 0 | 1500 |
| H | 4-5 | 0 | 0 | 0 | 500 | 500 | 500 | 1500 |
| I | 5 | 0 | 0 | 0 | 0 | 500 | 0 | 500 |

TABLE 7

| TOTAL - CHANNEL NO. 2 | | | | | |
|---|---|---|---|---|---|
| ZONE NO. | 1 | 2 | 3 | 4 | 5 |
| BEST SCORING SEGMENTS FOUND IN | D | A | A | E-D | I-E-D |

TABLE 7-continued

| | TOTAL - CHANNEL NO. 2 | | | | |
|---|---|---|---|---|---|
| ZONE NO. | 1 | 2 | 3 | 4 | 5 |
| ANY SCANNED ZONE STRING SCORE | 1000 | 1000 | 1000 | 2500 | 3000 |

TABLE 8

| | | SEGMENT SCORES - CHANNEL NO. 3 | | | | | | |
|---|---|---|---|---|---|---|---|---|
| SEGMENT | ZONE SPAN | ZONE NO. 1 SCORE | ZONE NO. 2 SCORE | ZONE NO. 3 SCORE | ZONE NO. 4 SCORE | ZONE NO. 5 SCORE | CONSTRAINT SCORE | TOTAL SCORE |
| A | 1-2 | 500 | 500 | 0 | 0 | 0 | 0 | 1000 |
| B | 1-3 | 500 | 500 | 500 | 0 | 0 | 0 | 1500 |
| F | 3-5 | 0 | 0 | 500 | 500 | 500 | 0 | 1500 |
| H | 4-5 | 0 | 0 | 0 | 500 | 500 | 0 | 1000 |

TABLE 9

| | TOTAL - CHANNEL NO. 3 | | | | |
|---|---|---|---|---|---|
| ZONE NO. | 1 | 2 | 3 | 4 | 5 |
| BEST SCORING SEGMENTS FOUND IN ANY SCANNED ZONE | NO CANDIDATE | A | B | B | H-B |
| STRING SCORE | 0 | 1000 | 1500 | 1500 | 2500 |

TABLE 10

| | | SEGMENT SCORES - CHANNEL NO. 4 | | | | | | |
|---|---|---|---|---|---|---|---|---|
| SEGMENT | ZONE SPAN | ZONE NO. 1 SCORE | ZONE NO. 2 SCORE | ZONE NO. 3 SCORE | ZONE NO. 4 SCORE | ZONE NO. 5 SCORE | CONSTRAINT SCORE | TOTAL SCORE |
| A | 1-2 | 500 | 500 | 0 | 0 | 0 | 0 | 1000 |
| F | 3-5 | 0 | 0 | 500 | 500 | 500 | 0 | 1500 |

TABLE 11

| | TOTAL SCORES - CHANNEL NO. 4 | | | | |
|---|---|---|---|---|---|
| ZONE NO. | 1 | 2 | 3 | 4 | 5 |
| BEST SCORING SEGMENTS FOUND IN ANY SCANNED ZONE | NO CANDIDATE | A | A | A | F-A |
| STRING SCORE | 0 | 1000 | 1000 | 1000 | 3500 |

It should be noted that the invention as described above provides an optimum solution to the packing of each channel. This optimum solution is attained by consideration of each segment exactly once, rather than having to try all possible combinations of segments, thereby providing a greatly reduced time needed to arrive at the optimum solution. The invention will not necessarily provide the optimum solution for the bay as a whole, but the solution obtained for the whole bay will be excellent, especially considering the relatively small amount of complication involved.

This completes the description of the preferred embodiments of the invention. Although preferred embodiments have been described, it is believed that numerous alterations and modifications thereto would be apparent to one having ordinary skill in the art without departing from the spirit and scope of the invention. Particularly, it is to be noted that the invention is not limited to any particular scoring procedure, and the procedure given above is merely an example of one possibility. Specifically, other factors may be utilized in computing scores, depending upon the particular situation at hand. For instance, scores may take into account varying numbers of available channels in the bay, technology rules related to minimum distances between wires, electrical performance characteristics such as resistance and capacitance, the need for certain "critical paths", segment lengths, the need for blank spaces between certain wires, and other factors. Moreover, it should be recognized that the invention is applicable to a case where one or more of the channels is partially blocked, that is, each channel need not be clear for its entire length.

We claim:

1. A method of producing an integrated circuit comprising a plurality of circuits and at least one wiring bay comprising a plurality of wiring channels, said wiring bay having first and second ends and said wiring channels extending adjacent one another between said first and second ends, said circuits being interconnected by wiring segments disposed in respective channels, each wiring segment having start and end points, said method comprising the steps of assigning to each of said circuits a location in said integrated circuit, packing said wiring bays by assigning wiring segments to respective ones of said channels to obtain an integrated circuit design, and fabricating said integrated circuit in accordance with said integrated circuit design, said packing step comprisng:

A. selecting an unpacked channel from among said wiring channels;

B. assembling a list of segments available for packing on that channel;

C. for the channel selected in said step A:

(1) assigning a score to each of said available segments;

(2) starting from said first end of said wiring bay and moving toward said second end of said wiring bay, upon occurrence of an end point of any segment, determining a total score for said selected channel by adding to the score of said any segment a best string score for any string of segments at last end point of which occurs before a start point of said any segment;

(3) if said total score exceeds a present value of a best string score for any string of segments, retaining said total score as a new value of said best string score for any string of segments and recording an identifier for said any segment, otherwise retaining said present value of said best string score for any string of segments;

(4) repeating said steps (2) and (3) until said second end of said wiring bay is reached and a final best string score is obtained, said final best string score corresponding to a final string of segments comprising those segments for which identifiers have been recorded in said step (3);

(5) from said second end of said wiring bay and moving toward said first end of said wiring bay, assigning to said selected channel at last segment in said final string for which an identifier was recorded in said step (3) and which has not yet been assiged to said selected channel; and D. repeating said steps A to C until all said segments have been assigned to a channel.

2. The method of claim 1, wherein said step (2) of determining said total score is performed for each end point of each of said segments.

3. The method of calim 2, wherein said step B of assembly said list of segments available for packing comprises assembling a list of start points, end points and segment identifiers for each of said segments.

4. The method of claim 3, wherein said step (2) of determining said total score comprises, for each segment, if said total score exceeds said present value of said best string score for any string of segments, recording at a location identified with the end point of said segment said new total score and the corresponding segment identifier of said segment.

5. The method of claim 1, further comprising the step of dividing said wiring bay into zones with zone boundaries occurring at each start point of each of said segments for which an end point of at least one segment has occurred in a contiguous prior zone.

6. The method of claim 1, further comprising the step of dividing said wiring bay into zones with zone boundaries occurring between a start point of each of said segments and an end point of a segment which has occurred in a contiguous prior zone.

7. The method of claim 6, wherein said step (2) of determining said total score is performed at each said zone boundary for all segments having an end point in a zone contiguously preceding said zone boundary.

8. The method of claim 1, wherein said step A of selecting an unpacked channel comprises selecting channels in order starting from one side of said wiring bay.

9. The method of claim 1, wherein said step A of selecting an unpacked channel comprises alternately selecting channels from opposite sides of said bay.

10. The method of claim 1, wherein said step A of selecting an unpacked channel comprises selecting channels in a predetermined order starting from a center of said bay.

11. A method of producing an integrated circuit comprising a plurality of circuits and at least one wiring bay comprising a plurality of wiring channels, said wiring bay having two ends and said wiring channels extending adjacent one another between said two ends, said circuits being interconnected by wiring segments disposed in respective channels, each wiring segment having start and end points, said method comprising the steps of assigning to each of said circuits a location in said integrated circuit, packing said wiring bays by assigning wiring segments to respective ones of said channels to obtain an integrated circuit design, and fabricating said integrated circuit in accordance with said integrated circuit design, said packing step comprising:

(1) selecting an unpacked channel from among said wiring channels;

(2) assembling a list of segments available to be packed in said channel by eliminating segments already packed and segments constrained from being packaged in the selected channel, and including a start point, an end point and a segment identifier for each of said segments in said list;

(3) incrementing a pointer variable until the occurrence of an end point of a segment in said list is encountered;

(4) if said pointer variable has reached a value corresponding to an end of said wiring bay, proceeding to step (11);

(5) if a start point of a segment has been encountered in said step (3), determining a score for said segment;

(6) computing a new total score by adding to said score for said segment a highest previously recorded total score for any string of segments which end before the start point of said segment;

(7) recording said total score;

(8) comparing said total score with all previously recorded total scores, and if said total score is higher than any total score previously recorded, recording said identifier for said segment at a location identified with the end point of said segment;

(9) incrementing said value of said pointer variable until the next end point of a segment is encountered;

(10) continuously repeating said steps (3) to (9) until said pointer variable has reached one of the last end point of any of said segments and said end of said bay;

(11) decrementing said pointer variable until an end point of one of said segments is reached for which a segment identifier has been recorded;

(12) assigning the segment identified by said identifier in step (11) to said channel;

(13) decrementing said pointer variable to a point prior to the start point of the immediately previously assigned segment;

(14) continuing to decrement said pointer variable until an end point of a segment is again reached for which a segment identifier has been recorded;

(15) assigning to said channel said segment identified by said segment identifier in said step (14);

(16) repeating said steps (2) to (15) until said pointer variable has reached a value corresponding to said start of said bay; and

(17) repeating said steps (2) to (16) for subsequent channels while eliminating from said list segments which have already been packed in a previously packed channel.

12. A method of producing an integrated circuit comprising a plurality of circuits and at least one wiring bay comprising a plurality of wiring channels, said wiring bay having two ends and said wiring channels extending adjacent one another between said two ends, said circuits being interconnected by wiring segments disposed in respective channels, each wiring segment having start and end points, said method comprising the steps of assigning to each of said circuits a location in said integrated circuit, packing said wiring bays by assigning wiring segments to respective ones of said channels to obtain an integrated circuit design, and fabricating said integrated circuit in accordance with said integrated circuit design, said packing step comprising:
(1) selecting an unpacked channel from among said wiring channels;
(2) assembling a list of segments available to be packed in said channel by eliminating segments already packed and segments constrained from being packed in the selected channel, and including a start point, an end point and a segment identifier for each of said segments in said list;
(3) dividing said channel into zones with zone boundaries located at start points of each segment for which at least one segment has an end point in a contiguous prior zone;
(4) incrementing a pointer variable until a zone boundary is encountered;
(5) if said pointer variable has reached a value corresponding to an end of said wiring bay, proceeding to step (12);
(6) if a start point of a segment has been encountered in said step (4), determining a score for said each segment having an end point in the contiguous prior zone;
(7) computing a new total score by adding to said score for each said segment having an end point in the contiguous prior zone a highest previously recorded total score for any string of segments which end before the start point of said segment;
(8) recording said total score;
(9) comparing said total score with all previously recorded total scores, and if said total score is higher than any total score previously recorded, recording said identifier for said segment;
(10) incrementing said value of said pointer variable until the next zone boundary is encountered;
(11) continuously repeating said steps (5) to (10) until said pointer variable has reached one of the last end point of any of said segments and said end of said bay;
(12) assigning to said channel a last segment for which an identifier was recorded;
(13) assigning to said channel a segment having an end point closest to but not beyond the start point of the immediately previously assigned segment;
(14) repeating said step (13) until no more segments are available to be assigned to said channel; and
(15) repeating said steps (2) to (14) for subsequent channels while eliminating from said list segments which have already been packed in a previously packed channel.

13. A circuit device having at least one wiring bay, said circuit device being produced in accordance with the method comprising the steps of:
A. selecting an unpacked channel from among a plurality of wiring channels in said wiring bay;
B. assembling a list of segments available to be packed in the selected channel by eliminating segments already packed and segments constrained from being packed in said channel;
C. for the channel selected in said step A:
(1) determining a score for each of said segments;
(2) starting from one end of said wiring bay and moving toward the other end of said wiring bay, upon occurrence of an end point of any segment, determining a total score by adding to the score of said segment a best string score for any string of segments a last end point of which occurs before a start point of said segment;
(3) if said total score exceeds a present value of a best string score for any string of segments, retaining as a new value of said best string score for any string of segments said total score and recording an identifier for said segment, otherwise retaining said present value of said best string score for any string of segments;
(4) repeating said steps (2) and (3) until said other end of said wiring bay is reached;
(5) from said other end of said wiring bay and moving toward said one end of said wiring bay, packing in said selected channel a last segment for which in said step (3) said total score exceeded said present value of said best string score for any string of segments and subsequently encountered segments for which in said step (3) and total score exceeded said present value of said best string score for any string of segments having an end point occurring before a start point of a previously packed segment; and
D. repeating said steps A to C until all said segments have been assigned to a channel.

14. The circuit device of claim 13, wherein said step (2) of determining said total score is performed for each end point of each said segments.

15. The circuit device of claim 14, wherein said step B of assembling said list of segments to be packed comprises assembling a list of start points, end points and segment identifiers for each of said segments.

16. The circuit device of claim 15, wherein said step (2) of determining said total score comprises, for each segment, if said total score exceeds said present value of said best string score for any string of segments, recording at a location identified with the end point of said segment said total score and the corresponding segment identifier of said segment.

17. The circuit device of claim 13, further comprising the step of dividing said wiring bay into zones with zone boundaries occurring at each start point, moving toward said other end of said bay, of each of said segments for which an end point of at least one segment has occurred in a contiguous prior zone.

18. The device of claim 17, wherein said step (2) of determining said total score is performed at each said zone boundary for all segments having an end point in a zone contiguously preceding each said zone boundary.

19. The circuit device of claim 17, wherein said step A of selecting an unpacked channel comprises selecting channels in order starting from one side of said wiring bay.

20. The circuit device of claim 13, further comprising the step of dividing said wiring bay into zones with zone boundaries occurring between a start point of a segment and an end point of a segment which has occurred in a contiguous prior zone.

21. A circuit device having at least one wiring bay, said circuit device being produced in accordance with the method comprising the steps of:
(1) selecting an unpacked channel from among a plurality of wiring channels in said wiring bay;
(2) assembling a list of segments available to be packed in said channel by eliminating segments already packed and segments constrained from being packed in the selected channel, and including a start point, and end point and a segment identifier for each of said segments;

(3) incrementing a pointer variable until the occurrence of an end point of a segment in said list is encountered;

(4) if said pointer variable has reached a value corresponding to an end of said wiring bay, proceeding to step (11);

(5) if a start point of a segment has been encountered in said step (3), determining a score for said segment;

(6) computing a new total score by adding to said score for said segment a highest previously recorded total score for any string of segments which end before the start point of said segment;

(7) recording said total score;

(8) comparing said total score with all previously recorded total scores, and if said total score is higher than any total score previously recorded, recording said identifier for said segment at a location identified with the end point of said segment;

(9) incrementing said value of said pointer variable until the next end point of a segment is encountered;

(10) continuously repeating said steps (4) to (9) until said pointer variable has reached one of the last end point of any of said segments and said end of said bay;

(11) decrementing said pointer variable until an end point of one of said segments is reached for which a segment identifier has been recorded;

(12) assigning the segment identified by said identifier in step (11) to said channel;

(13) decrementing said pointer variable to a point prior to the start point of the immediately previously assigned segment;

(14) continuing to decrement said pointer variable until an end point of a segment is again reached for which a segment identifier has been recorded;

(15) assigning to said channel said segment identified by said segment identifier in said step (14);

(16) repeating said steps (13) to (15) until said pointer variable has reached a value corresponding to said start of said bay; and

(17) repeating said steps (2) to (16) for subsequent channels while eliminating from said list segments which have already been packed in a previously packed channel.

22. The circuit device of claim 21, wherein said step (1) of selecting an unpacked channel comprises alternately selecting channels from oposite sides of said bay.

23. A circuit device having at least one wiring bay, said circuit device being produced in accordance with the method comprising the steps of:

(1) selecting an unpacked channel from among a plurality of wiring channels in said wiring bay;

(2) assembling a list of segments to be packed in said channel including a start point, an end point and a segment identifier for each of said segments;

(3) dividing said channel into zones with zone boundaries located at start points of each segment for which at least one segment has an end point in a contiguous prior zone;

(4) incrementing a pointer variable until a zone boundary is encountered;

(5) if said pointer variable has reached a value corresponding to an end of said wiring bay, proceeding to step (12);

(6) if a start point of a segment has been encountered in said step (4), determining a score for said each segment having an end point in the contiguous prior zone;

(7) computing a new total score by adding to said score for each said segment having an end point in the contiguous prior zone a highest previously recorded total score for any string of segments which end before the start point of said segment;

(8) recording said total score;

(9) comparing said total score with all previously recorded total scores, and if said total score is higher than any total score previously recorded, recording said identifier for said segment;

(10) incrementing said value of said pointer variable until the next zone boundary is encountered;

(11) continuously repeating said steps (4) to (10) until said pointer variable has reached one of the last end point of any of said segments and said end of said bay;

(12) assigning to said channel a last segment for which an identifier was recorded;

(13) assigning to said channel a segment having an end point closest to but not beyond the start point of the immediately previously assigned segment;

(14) repeating said step (13) until no more segments are available to be assigned to said channel; and

(15) repeating said steps (2) to (14) for subsequent channels while eliminating from said list segments which have already been packed in a previously packed channel.

24. The circuit device of claim 23, wherein said step (1) of selecting an unpacked channel comprises selecting channels in a predetermined order starting from a center of said bay.

* * * * *